(12) United States Patent
Pipe

(10) Patent No.: US 7,030,609 B2
(45) Date of Patent: *Apr. 18, 2006

(54) SPLIT-BLADE DATA COLLECTION FOR PROPELLER MRI

(75) Inventor: James G. Pipe, Peoria, AZ (US)

(73) Assignee: Catholic Healthcare West, California Nonprofit Benefit Corporation, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/052,716

(22) Filed: Jan. 26, 2005

(65) Prior Publication Data

US 2005/0127912 A1    Jun. 16, 2005

Related U.S. Application Data

(63) Continuation of application No. 10/604,597, filed on Aug. 1, 2003, now Pat. No. 6,882,148.

(60) Provisional application No. 60/481,075, filed on Jul. 9, 2003.

(51) Int. Cl.
*G01V 3/00* (2006.01)

(52) U.S. Cl. .................................................... 324/309

(58) Field of Classification Search ................ 324/307, 324/309, 318; 600/410; 382/128, 131
See application file for complete search history.

(56) References Cited

U.S. PATENT DOCUMENTS

| | | | |
|---|---|---|---|
| 4,570,119 A | 2/1986 | Wehrli et al. | |
| 4,884,029 A * | 11/1989 | Sattin | 324/309 |
| 4,920,314 A | 4/1990 | Satoh | |
| 4,940,941 A | 7/1990 | Rzedzian | |
| 5,493,224 A * | 2/1996 | Shiono et al. | 324/309 |
| 5,497,773 A | 3/1996 | Kuhara et al. | |
| 5,539,312 A * | 7/1996 | Fu et al. | 324/309 |
| 5,548,215 A * | 8/1996 | Kohno et al. | 324/309 |
| 5,697,370 A | 12/1997 | Pelc et al. | |
| 5,722,409 A | 3/1998 | Kuhara et al. | |
| 5,745,665 A * | 4/1998 | Pasco | 345/427 |
| 5,818,229 A | 10/1998 | Kanazawa | |
| 5,833,609 A * | 11/1998 | Dannels et al. | 600/410 |
| 5,841,890 A * | 11/1998 | Kraske | 382/131 |
| 6,008,813 A * | 12/1999 | Lauer et al. | 345/424 |
| 6,075,362 A | 6/2000 | Loncar et al. | |
| 6,154,029 A | 11/2000 | Miyamoto et al. | |
| 6,249,595 B1 | 6/2001 | Foxall et al. | |
| 6,265,873 B1 | 7/2001 | Le Roux | |
| 6,285,187 B1 | 9/2001 | Mock | |

(Continued)

OTHER PUBLICATIONS

Guillion, T. et al., New, Compensated Carr-Purcell Sequences, Journal of Magnetic Resonance, 1990, vol. 89, pp. 479-484.

(Continued)

*Primary Examiner*—Diego Gutierrez
*Assistant Examiner*—Dixomara Vargas
(74) *Attorney, Agent, or Firm*—Ziolkowski Patent Solutions Group, SC

(57) ABSTRACT

The present invention provides a system and method of MR imaging particularly applicable with fast spin echo protocols. Odd and even echoes are used to create separate blades or strips in k-space. Preferably, each blade extends through the center of k-space. The blades are incrementally rotated about the center of k-space with each echo train until a full set of k-space data is acquired. After a phase correction, each odd and even blade is combined into a single k-space data set that is used for image reconstruction.

19 Claims, 4 Drawing Sheets

U.S. PATENT DOCUMENTS

| | | |
|---|---|---|
| 6,373,249 B1 | 4/2002 | Kwok et al. |
| 6,529,001 B1 | 3/2003 | Mock |
| 6,556,009 B1 | 4/2003 | Kellman et al. |
| 6,611,143 B1 | 8/2003 | Kuhara |
| 6,683,454 B1 | 1/2004 | Rehwald et al. |
| 6,697,507 B1 * | 2/2004 | Chapman .................... 382/131 |
| 6,771,067 B1 | 8/2004 | Kellman et al. |

OTHER PUBLICATIONS

Bastin, M.E. et al., Application of Non-CPMG Fast-Spin-Echo Sequences to MR Diffusion Imaging, Proceedings for the International Society for Magnetic Resonance in Medicine, 9th Annual Scientific Meeting and Exhibition, 2001, Glasgow, Scotland, UK, p. 1549.

Le Roux, P., Spin Echoes with a Quadratic Phase Modulation of the RF Pulse Train, Proceedings for the International Society for Magnetic Resonance in Medicine, 9th Annual Scientific Meeting and Exhibition, 2001, Glasgow, Scotland, UK, p. 1788.

Murdoch, J.B., An "Effective" Method for Generating Spin-Echo Intensity Expressions, Proceedings for the International Society for Magnetic Resonance in Medicine, 2nd Annual Scientific Meeting and Exhibition, 1994, San Francisco, California, USA, p. 1145.

Pipe, J.G. et al., Multishot Diffusion-Weighted FSE Using PROPELLER MRI, Magnetic Resonance in Medicine, 2002, vol. 47, pp. 42-52.

Alsop, D.C., Phase Insensitive Preparation of Single-Shot RARE: Application to Diffusion Imaging in Humans Magnetic Resonance in Medicine, 1997; vol. 38, pp. 527-533.

* cited by examiner

SPLIT-BLADE DATA COLLECTION FOR PROPELLER MRI

CROSS-REFERENCE TO RELATED APPLICATIONS

The present application is a continuation and claims priority of U.S. patent application Ser. No. 10/604,597 filed Aug. 1, 2003 now U.S. Pat. No. 6,882,148, the disclosure of which is incorporated herein and which claims the benefit of U.S. Ser. No. 60/481,075 filed Jul. 9, 2003.

BACKGROUND OF THE INVENTION

The present invention relates generally to a method of MR imaging and, more particularly, to a method and apparatus of split-blade data collection for PROPELLER MRI.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast Spin Echo (FSE) imaging is an imaging technique commonly used as an efficient method of collecting MRI data with minimal artifact. Generally, FSE requires that the refocusing $B_1$ pulses be applied between each echo such that their phase is substantially identical to that of the initial spin phase after excitation, commonly referred to as the "CPMG" condition. If this condition is not met, the resulting MR signal is general highly sensitive to the strength of $B_1$, and therefore will generally decay rapidly in successive echoes.

As a result, FSE imaging with diffusion weighting (FSE-DWI) may be difficult, in general, since even minute patient motion during application of diffusion weighting gradients leaves the spins with a spatially varying and unknown starting phase prior to the spin-echo train. A number of imaging techniques have been developed that alters the phase of the refocusing pulses to attempt to delay the inevitable signal decay. However, these known techniques have been shown to prolong the signal magnitude, but, in general, cause a spatially varying phase which alternates between successive echoes, i.e. the signal in odd echoes encode an additive phase $\alpha(x,y)$, and even echoes encode the opposite phase $-\alpha(x,y)$. This makes combining the two sets of echoes difficult.

FSE imaging is an imaging technique that has been implemented with a number of pulse sequence designs. For example, one FSE technique, which is commonly referred to as Periodically Rotated Overlapping Parallel Lines with Enhanced Reconstruction (PROPELLER) imaging, encodes an MR signal by collecting data during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution.

Referring now to FIG. 5, a portion of a conventional pulse sequence 108 to acquire MR data in accordance with a PROPELLER protocol is shown. It should be noted that the phase encoding pulses, balancing gradients, and gradient crushers are not shown. The pulse sequence 108, in the illustrated example, is designed to acquire 12 spin-echoes 110 from a region of interest. The spin-echoes are all collected relative to single axis, e.g. $G_x$. In this regard, the 12 spin-echoes include odd spin-echoes as well as even spin-echoes. Each spin-echo 110 is acquired following an RF refocussing pulse 112 and during a frequency encoding pulse 114 a series of which are played out during steady-state conditions. The spin echo data is used to fill k-space which is schematically represented in FIG. 6.

FIG. 6 illustrates schematically a k-space 116 to be filled with MR data. With a conventional PROPELLER protocol, each echo acquired corresponds to a single line 118 of k-space 116. As such, for a 12 spin-echo data acquisition, each blade 120 of k-space includes 12 lines of data: In the illustrated example, each dashed line 122 represents an odd spin-echo trajectory and the solid lines 124 represent the even spin-echo trajectories. As shown, the even spin-echoes 124 are placed in a center of the k-space blade 120 and the odd spin-echoes 122 are placed about a periphery of the even spin-echo lines 124.

As is well-known, PROPELLER based imaging implements a rotation of the blades of k-space data with each echo-train. In this regard, the blade of k-space will be incrementally rotated about the center 126 of k-space with each echo-train acquisition until k-space is filled. When the k-space is filled, the MR data will undergo at least one of a number of known transformation techniques to generate an imaging space used to reconstruct an image of the subject. As discussed below, this protocol and processing is sufficient when a combination transmit/receive coil is used; however, is problematic when the MR study calls for separate transmit and receive coils.

It has been shown that the phase difference between the transmitter and receiver coil of the MR system to acquire the data is the same (e.g. with a T/R coil), odd and even lines of k-space can be combined into a single blade despite the presence of the $+/-\alpha(x,y)$ phase referenced above. Customarily, a Fourier process is implemented that exploits the conjugate symmetry between the odd and even lines of k-space. However, if data are collected using a separate transmit and receive coil, such that the relative phase difference between the refocusing pulses and the receiver is spatially varying, the Fourier process is unworkable. Thus, PROPELLER FSE-DWI as well as other similar constructed pulse sequences based on FSE imaging techniques have thus far been limited to use with a single transmit-receive coil. Further, it has been shown insufficient to simply use separate receive coils because artifacts will appear in the reconstructed image wherein the severity of the artifact will be a function of the relative change in phase between the transmit and receive coils.

It would therefore be desirable to have a system and method of MR imaging implementing a PROPELLER or similar imaging protocol with a separate transmit and receive coils for data acquisition with reduced or minimal image artifact.

BRIEF DESCRIPTION OF THE INVENTION

The present invention provides a system and method of MR imaging particularly applicable with FSE protocols that overcome the aforementioned drawbacks. Odd and even echoes are used to create separate blades or rectangular strips in k-space. Preferably, each blade extends through the center of k-space. The blades are incrementally rotated about the center of k-space with each echo train until a full set of k-space data is acquired. After a phase correction, corresponding odd and even blades of respective region of k-space are combined into a single blade of k-space data that is used for image reconstruction.

Therefore, in accordance with one aspect of the present invention, a method of diffusion weighted MR imaging includes the step of, for each echo train, splitting MR data acquisition into non-parallel odd and even echo acquisition blades. The method also includes the steps of, for each subsequent echo train, rotating the blades of data acquisition about an origin point with respect to a previous acquisition and combining data collected from each odd and even data acquisition into a composite set of MR data for reconstruction.

According to another aspect of the invention, an MR apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The apparatus also includes a computer programmed to segment acquisition of each echo train into an odd section and an even section, wherein each section at least extends through an origin point, acquire a segment of data, and rotate each segmented acquisition a prescribed interval about the origin point for each subsequent echo train. The computer is also programmed to combine MR data from corresponding odd and even sections into a composite set of MR data and reconstruct an image from the composite set.

In accordance with another aspect of the present invention, a computer readable storage medium having stored thereon a computer program comprising instructions which when executed by a computer cause the computer to, for each echo train, segment data acquisition into an odd data acquisition and even data acquisition. The instructions further cause the computer to associate a strip of k-space extending through a center of k-space for each data acquisition and rotate the strip of k-space for the odd data acquisition and the even data acquisition for each subsequent echo train. The computer is then caused to combine parallel strips of data collected for each odd and even acquisition into a composite set of MR data for image reconstruction.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
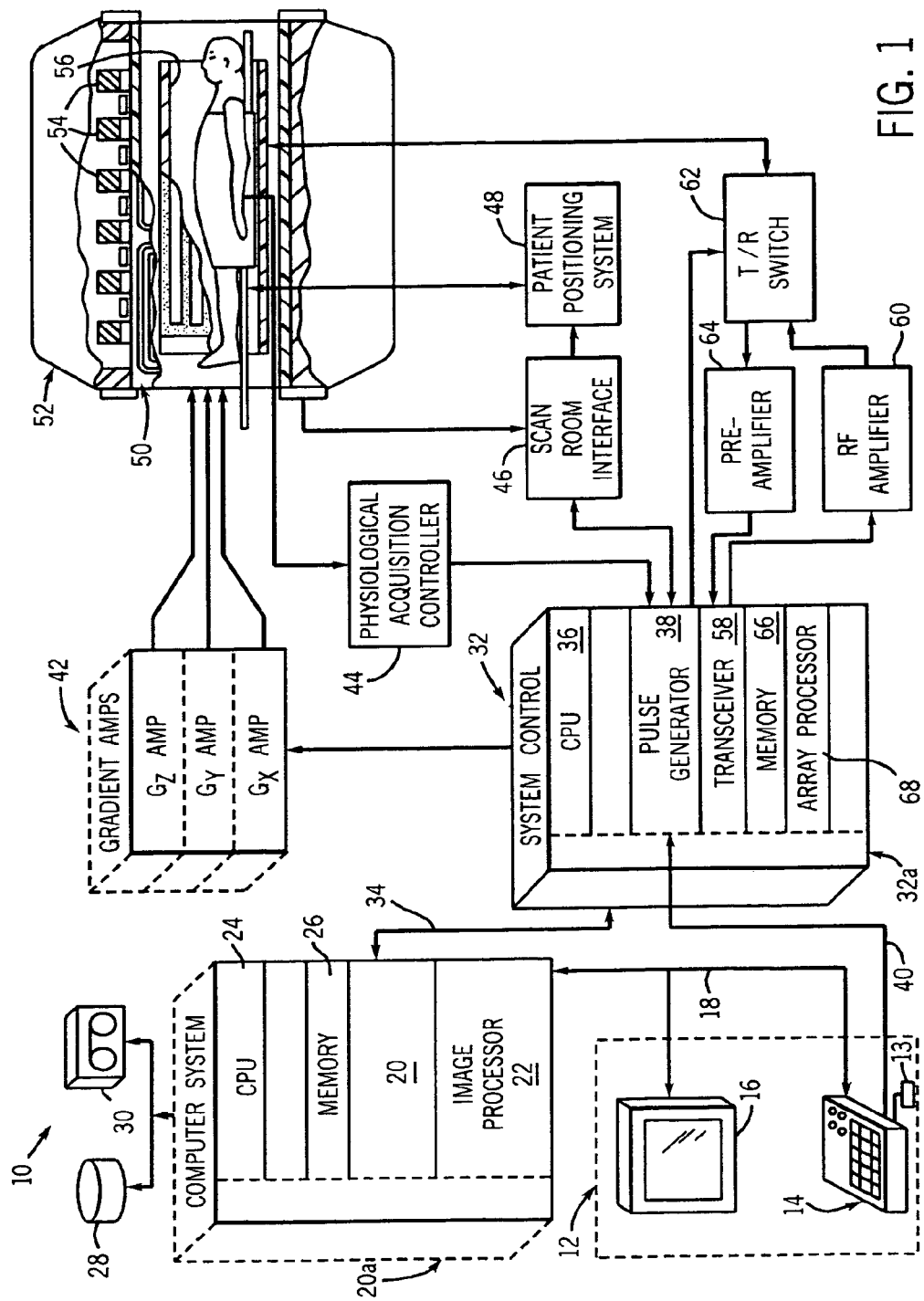
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention provides a system and method of MR imaging particularly applicable with FSE protocols such as PROPELLER and variants of PROPELLER such as "TURBOPROP" Diffusion Weighting. Odd and even echoes are used to create separate blades or strips in k-space. Preferably, each blade extends through the center of k-space. The blades are incrementally rotated about the center of k-space with each echo train until a full set of k-space data is acquired. After a phase correction, all odd and even blades are combined into a single k-space data set that is used for image reconstruction.

Preferably, each blade or strip of k-space will be similarly sized. That is, the blades for the odd echoes will occupy an equivalent sized portion of k-space than the blades for the even echoes. Additionally, k-space is organized into a number of sections whereupon each section includes or is composed of odd echoes or even echoes. Moreover, the lines of k-space within each section are parallel with respect to one another. As will be described in greater detail below, the odd and even sections are perpendicularly oriented with respect to one another in k-space. With each echo train, even and odd echoes are acquired. After each train that is acquired, the odd and even blades are rotated about an origin point As such, k-space is filled over a series of echo trains. The odd and even sections of the filled k-space that are parallel with one another are then combined to form a single combined blade of data. This combined data set, as will be described, is then used in the image reconstruction process.

Further, each blade is preferably twice as narrow as a single composite blade that combines both odd and even echoes. The two split blades (from odd and even echoes) may measure the same area of k-space, or may be rotated with respect to each other in k-space. For example, in one embodiment, the blades or strips of k-space for the odd echoes are perpendicularly (orthogonally) arranged relative to the blades or strips of k-space for the even echoes. With either implementation, image SNR does not suffer from splitting the odd and even echoes into separate blades.

The organization of k-space acquisition into blades of odd echoes and blades of even echoes allows PROPELLER FSE-DWI to be used with surface coils or phased array coils without loss in SNR or minimum scan time. This is particularly advantageous for whole body applications, multichannel head coils, and parallel imaging. Additionally, the present invention optimizes signal acquisition. That is, by splitting odd and even echoes, and recombining the echoes into a composite data set after phase correction utilizes the entirety of the MR signal thereby preventing portions of the MR signal being discarded and not used for imaging. Simply, the MR signal is not crushed as is customary for other imaging protocols. Further, the heretofore described imaging technique and k-space data acquisition protocol is equivalently applicable with "TURBOPROP" imaging techniques as well as other variants of the PROPELLER protocol.

Figure 2:
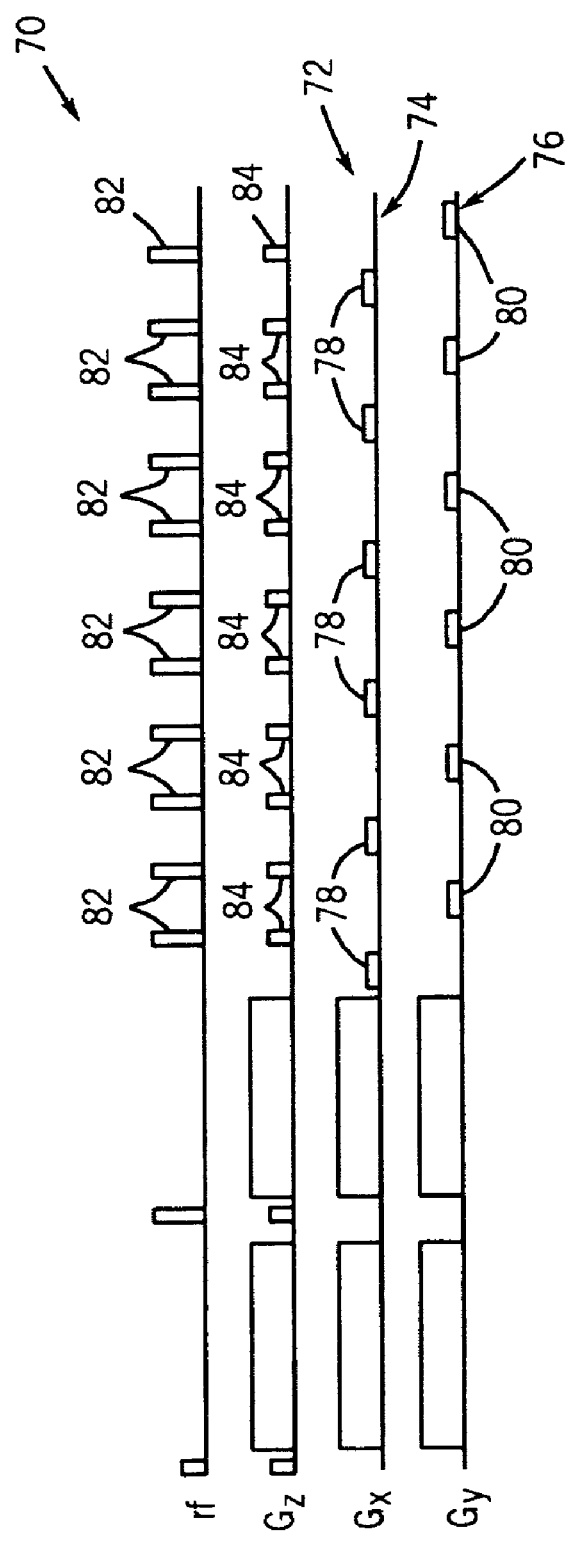
FIG. 2 illustrates a portion of a split-blade PROPELLER pulse sequence in accordance with the present invention.
Figure 5:
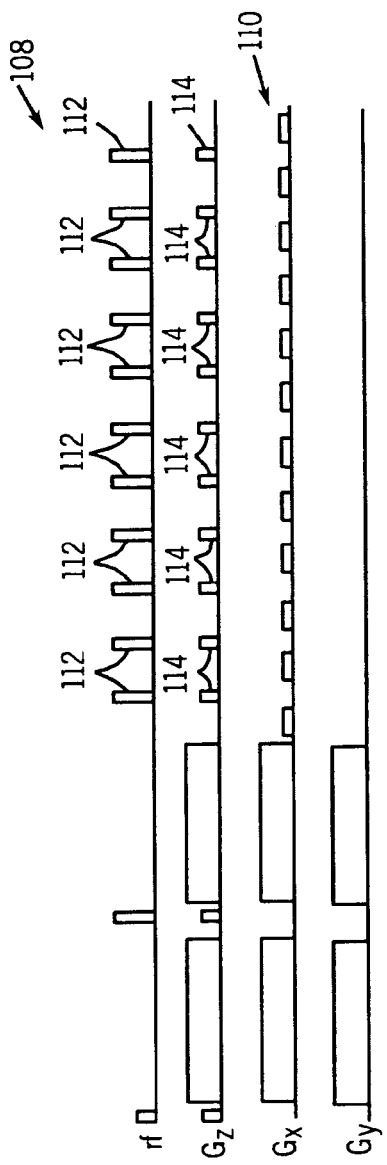
FIG. 5 illustrates a portion of a prior art PROPELLER pulse sequence.

Referring now to FIG. 2, a portion of a split-blade PROPELLER protocol is illustrated for a 12 spin-echo data acquisition. The pulse sequence 70 is constructed such that 12 spin-echoes of a spin-echo train 72 are acquired each repetition interval (TR). However, one skilled in the art will readily recognize that fewer or more than 12 spin-echoes may be acquired during each TR depending upon the parameters of the MR study and that a 12 spin-echo train illustrates one embodiment of the present invention. In contrast to that described with respect to FIG. 5, pulse sequence 70 is designed such that the echo train acquisition is segmented into an odd data acquisition or section 74 and an even data acquisition or section 76. In the illustrated example, the collective number of even and odd spin-echoes 78, 80, respectively, corresponds to the total number of spin-echoes in the echo train. Accordingly, only one spin-echo is collected after each imaging RF pulse 82 and each frequency encoding or readout gradient 84. In this regard, the acquisition of the odd and even spin-echoes is interleaved throughout the imaging RF pulse train.

Figure 3:
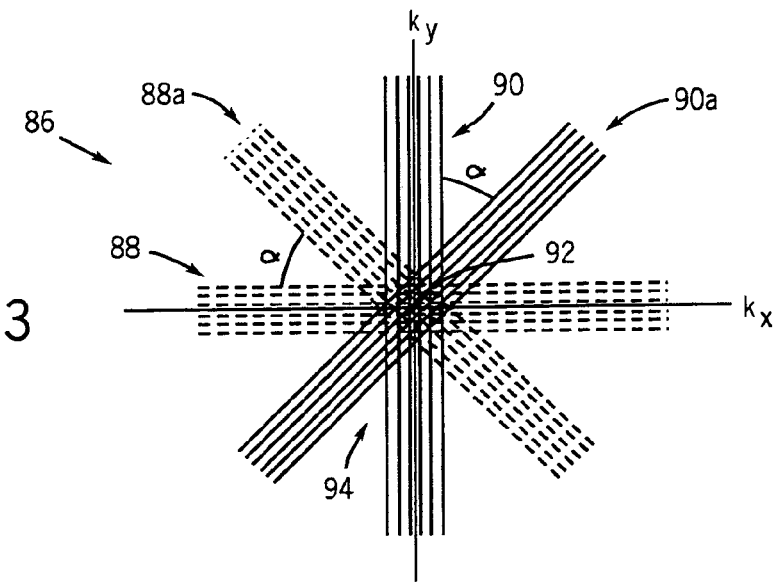
FIG. 3 is a schematic representation of a k-space filling scheme for the pulse sequence illustrated in FIG. 2.
Figure 6:
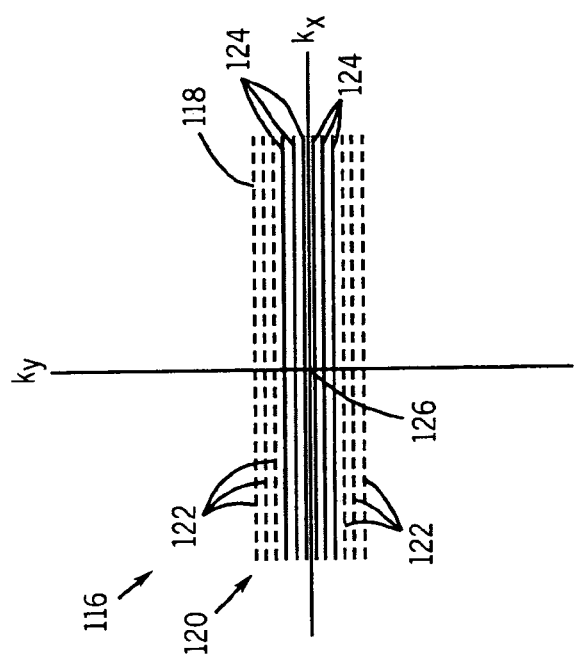
FIG. 6 illustrates a prior art k-space filling scheme for the pulse sequence illustrated in FIG. 5.

Referring now to FIG. 3, the filling of k-space in accordance with the above described pulse sequence is illustrated. K-space 86, in the illustrated embodiment, corresponds to data collected along a kx-ky axis. In the illustrated example, the odd spin-echoes are collected relative to a $G_x$ axis and the even spin-echoes are collected relative to a $G_y$ axis. Each line of k-space corresponds to a single spin-echo acquired. The lines of k-space associated with a single echo train correspond to or comprise a single blade or strip of k-space. Therefore, in the illustrated example, each blade 88, 90 has 6 lines of data. The width or occupied region of k-space of each blade is similar. Therefore, a blade comprising both odd and even spin-echoes would be equivalent to a single blade of non-segmented MR data such as that discussed and shown with respect to FIG. 6.

As illustrated, the blade 88 of odd spin-echoes is positioned in k-space orthogonally from blade 90, the even spin-echoes. However, the blades may be positioned non-orthogonally from one another. As discussed above, each blade of k-space is acquired during each echo train. To fill the entirety of k-space 86, the blades 88, 90 are rotated incrementally, around the center 92 of k-space. As such, with each data acquisition, both even and odd, the relative center of k-space 94 is reacquired or resampled which is advantageous for image quality. As the blades 88, 90 are rotated about origin point 92 with each subsequent echo train, k-space 86 is filled. With a 90 degree rotation of blades 88,

90 through subsequent TRs, a full k-space data set may be acquired that may be transformed into an imaging space for image reconstruction.

As discussed above, separate transmit and receive coils are problematic for conventional PROPELLER imaging. The present invention implements a blade-by-blade phase correction to remove both the bulk-motion-related phase from diffusion weighting and the phase inherent in each receiver of the MR system. That is, the phase correction process removes the M-phase typically associated with the motion of diffusion weighting gradients as well as the RT-phase variations typically associated with the differences in phase of the transmitter and receiver. Known phase correction techniques have been developed to correct the M-phase; however, it has been shown that these same phase correction techniques may be used to remove the RT-phase variations resulting between separate transmit and receive coils. As a result, the blades from the odd and even spin echoes may be combined in the same image with little, if any, time or SNR penalty.

Figure 4:
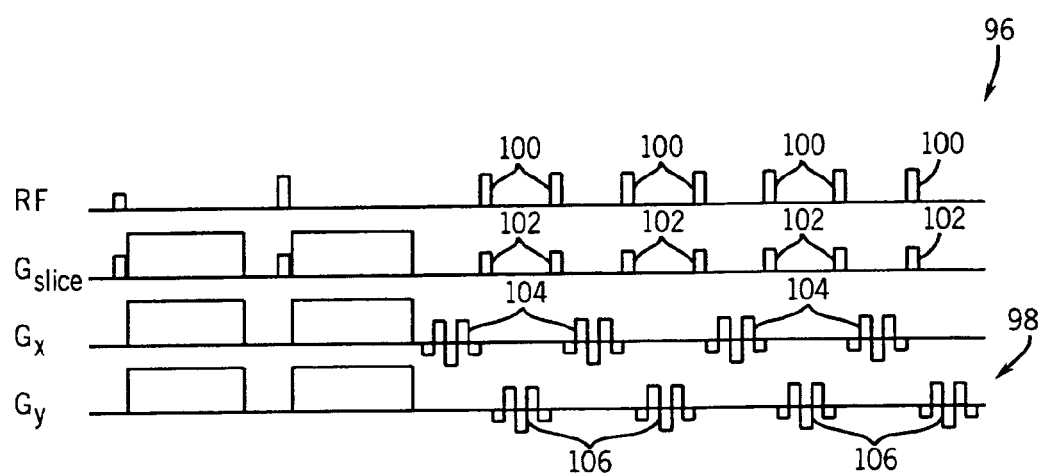
FIG. 4 illustrates a portion of a split-blade PROPELLER variant pulse sequence in accordance with the present invention.

Referring now to FIG. 4, a portion of a pulse sequence for a "TURBOPROP" implementation of the present invention is shown. Pulse sequence 96 is similar to the pulse sequence illustrated in FIG. 2; however, amplitude varying echoes 98 are acquired following each refocusing pulse 100 and readout pulse 102. As such, variable width odd and even blades 104, 106, respectively, of k-space are acquired during each echo train. Similar to the PROPELLER process described above, the blades are rotated with each TR such that the center of k-space is sampled each TR. As described above, the blades are segmented into odd and even data acquisitions. Each blade is then phase corrected before being combined to form a single blade of data for image reconstruction. In addition, by separating the odd and even echoes into separate blades, the data from the odd echoes, which tend to vary with $B_1$ inhomogeneities, can be removed as desired in the final reconstruction using a correlation-based weighting. This weighting technique, which is equivalently applicable with PROPELLER, adds data from different blades non-uniformly in areas of blade overlap.

Therefore, in accordance with one embodiment of the present invention, a method of diffusion weighted MR imaging includes the step of, for each echo train, splitting MR data acquisition into non-parallel odd and even echo acquisition blades. The method also includes the steps of, for each subsequent echo train, rotating the blades of data acquisition about an origin point with respect to a previous acquisition and combining data collected from each odd and even data acquisition into a composite set of MR data for reconstruction.

According to another embodiment of the invention, an MR apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The apparatus also includes a computer programmed to segment acquisition of each echo train into an odd section and an even section, wherein each section at least extends through an origin point, acquire a segment of data, and rotate each segmented acquisition a prescribed interval about the origin point for each subsequent echo train. The computer is also programmed to combine MR data from corresponding odd and even sections into a composite set of MR data and reconstruct an image from the composite set.

In accordance with another embodiment of the present invention, a computer readable storage medium having stored thereon a computer program comprising instructions which when executed by a computer cause the computer to, for each echo train, segment data acquisition into an odd data acquisition and even data acquisition. The instructions further cause the computer to associate a strip of k-space extending through a center of k-space for each data acquisition and rotate the strip of k-space for the odd data acquisition and the even data acquisition for each subsequent echo train. The computer is then caused to combine parallel strips of data collected for each odd and even acquisition into a composite set of MR data for image reconstruction.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising the steps of:
   for an echo train, splitting MR data acquisition into an odd and an even echo acquisition blade;
   for a subsequent echo train, rotating the odd and the even acquisition blades of data acquisition with respect to a previous acquisition and rotating the odd and the even acquisition blades with respect to a center of k-space; and
   reconstructing an image from the aquisition blades.

2. The method of claim 1 comprising the step of collecting each blade of MR data with a separate transmit and receive coil.

3. The method of claim 2 further comprising the step of phase correcting selected MR data to remove spatially varying phase differences between refocusing pulses applied to induce each echo train and the receive coil.

4. The method of claim 3 further comprising the step of phase correcting the collected MR data to remove spatially varying differences resulting from application of diffusion weighting gradients.

5. The method of claim 1 further comprising the step of reconstructing an image by combining data collected from at least some of the odd and even data acquisition blades into a set of MR data for image reconstruction.

6. The method of claim 1 further comprising the step of overlaying an odd and an even acquisition blade in k-space for a given echo train.

7. The method of claim 1 further comprising the step of applying a fast spin echo-diffusion weighted imaging pulse sequence to acquire each acquisition blade.

8. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
   segment acquisition of an echo train into at least first and second sections, wherein the at least first and second sections extend through a common reference point;
   acquire a segment of MR data;
   for a subsequent echo train, segment acquisition into the at least first and second sections and rotate the at least first and second sections a prescribed interval about the common reference point; and reconstruct an image from the at least first and second sections.

9. The MRI apparatus of claim 8 wherein the at least first and second sections include at least one even echo section and at least one odd echo section, and wherein the computer is further programmed to phase correct the MR data for each odd and even section.

10. The MRI apparatus of claim 9 wherein the computer is further programmed to initiate a fast spin echo-diffusion weighted imaging pulse sequence to acquire data for each odd and even section.

11. The MRI apparatus of claim 8 wherein the common reference point is in a central region of k-space.

12. The MRI apparatus of claim 8 wherein the first section for a given echo train is orthogonal to the second section for the given echo train.

13. The MRI apparatus of claim 8 further comprising a transmit RF coil configured to transmit an RF pulse toward a subject and a receive RF coil configured to receive signals from the subject for processing into MR data suitable for image reconstruction.

14. The MRI apparatus of claim 8 wherein the computer is further programmed to define the common reference point to be positioned off-center from a center of k-space.

15. A computer readable storage medium having stored thereon a computer program comprising instructions which when executed by a computer cause the computer to:

for an echo train, segment data acquisition into an odd data acquisition and an even data acquisition;

associate a strip of k-space extending through a center of k-space for the even data acquisition and a strip of k-space extending through the center of k-space for the odd data acquisition;

rotate the strips of k-space for acquisition from a subsequent echo train; and acquire data from the subsequent echo train for the rotated strips of k-space.

16. The computer readable storage medium of claim 15 wherein the set of instructions further causes the computer to phase correct each strip of k-space data and combine the strips of k-space acquired for the odd and the even acquisitions into a set of MR data for image reconstruction.

17. The computer readable storage medium of claim 15 wherein each strip of k-space includes multiple k-space lines.

18. The computer readable storage medium of claim 15 wherein the strip of k-space for an odd acquisition is rotated 90° from the strip of k-space for an even acquisition.

19. The computer readable storage medium of claim 15 wherein the set of instructions further causes the computer to execute and encode a plurality of echo trains and fill k-space with MR data acquired from the plurality of echo trains.

* * * * *